(12) United States Patent
Kim et al.

(10) Patent No.: US 10,109,705 B2
(45) Date of Patent: Oct. 23, 2018

(54) ULTRAHIGH VOLTAGE RESISTOR, SEMICONDUCTOR DEVICE, AND THE MANUFACTURING METHOD THEREOF

(71) Applicant: Magnachip Semiconductor, Ltd., Cheongju-si (KR)

(72) Inventors: Kwang Il Kim, Cheongju-si (KR); Young Bae Kim, Cheongju-si (KR)

(73) Assignee: Magnachip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 14/944,550

(22) Filed: Nov. 18, 2015

(65) Prior Publication Data

US 2016/0181351 A1 Jun. 23, 2016

(30) Foreign Application Priority Data

Dec. 22, 2014 (KR) .......................... 10-2014-0186348

(51) Int. Cl.
*H01L 49/02* (2006.01)
*H01L 27/02* (2006.01)
*H01L 27/06* (2006.01)
*H01L 29/78* (2006.01)
*H01L 29/10* (2006.01)

(52) U.S. Cl.
CPC .......... *H01L 28/20* (2013.01); *H01L 27/0207* (2013.01); *H01L 27/0629* (2013.01); *H01L 29/1095* (2013.01); *H01L 29/7801* (2013.01)

(58) Field of Classification Search
CPC ......... H01L 21/02532; H01L 21/02595; H01L 27/0207; H01L 27/0629; H01L 28/20; H01L 29/1095; H01L 29/7801; H01C 7/003; H01C 7/006
See application file for complete search history.

(56) References Cited

U.S. PATENT DOCUMENTS

| | | | | |
|---|---|---|---|---|
| 5,118,641 A | * | 6/1992 | Roberts | ............. H01L 21/76221 257/E21.258 |
| 8,624,322 B1 | * | 1/2014 | Su | ........................ H01L 27/0629 257/359 |
| 2010/0112764 A1 | * | 5/2010 | Mehrotra | ............ H01L 27/0629 438/210 |
| 2012/0280361 A1 | * | 11/2012 | Su | ........................... H01L 28/20 257/538 |
| 2012/0313692 A1 | | 12/2012 | Sutardja et al. | |
| 2014/0231952 A1 | * | 8/2014 | Hahn | ...................... H01L 28/20 257/489 |
| 2015/0194421 A1 | * | 7/2015 | Boos | ................... H01L 27/0623 257/370 |

* cited by examiner

*Primary Examiner* — Frederick B Hargrove
(74) *Attorney, Agent, or Firm* — NSIP Law

(57) ABSTRACT

An example provides a semiconductor device including an insulator with a predetermined thickness between a well region of a semiconductor substrate and a resistor of polysilicon. The insulator has a structure that is able to withstand an ultrahigh voltage, and thereby allows the manufacture of a semiconductor device resistor that can bear an ultrahigh voltage without increasing the size of a semiconductor substrate and a semiconductor device including such a resistor. Other examples provide a method for manufacturing such a semiconductor device.

17 Claims, 13 Drawing Sheets

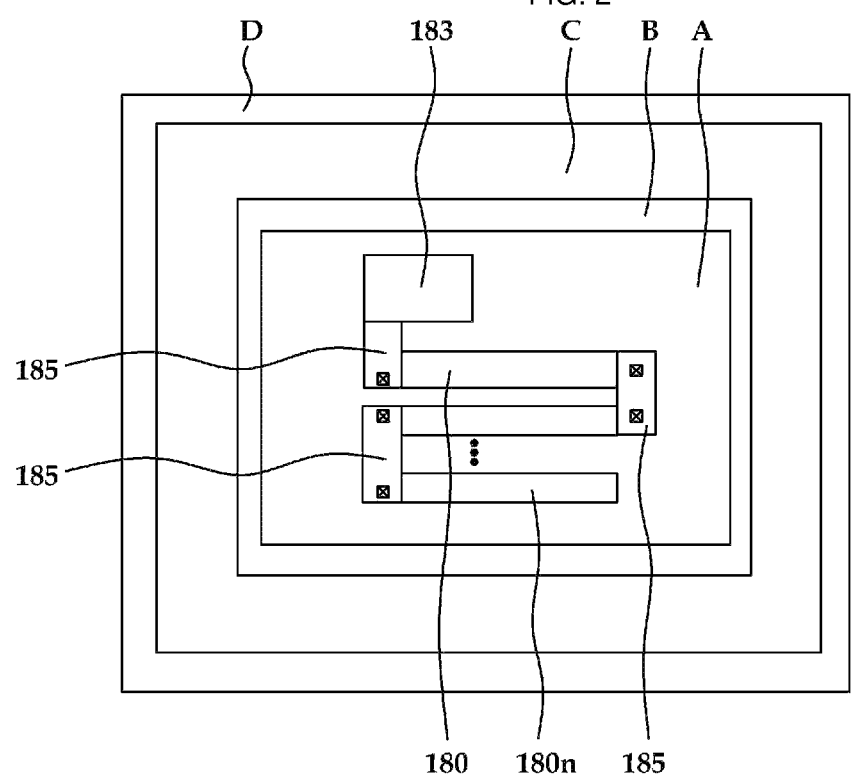

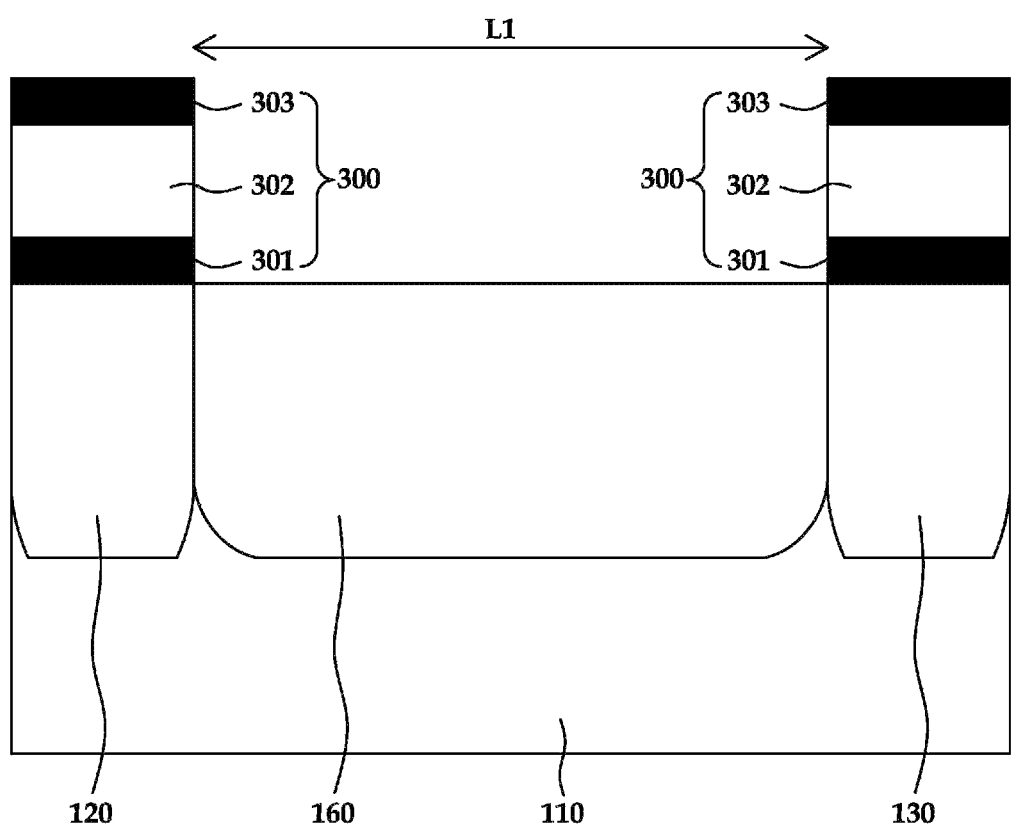

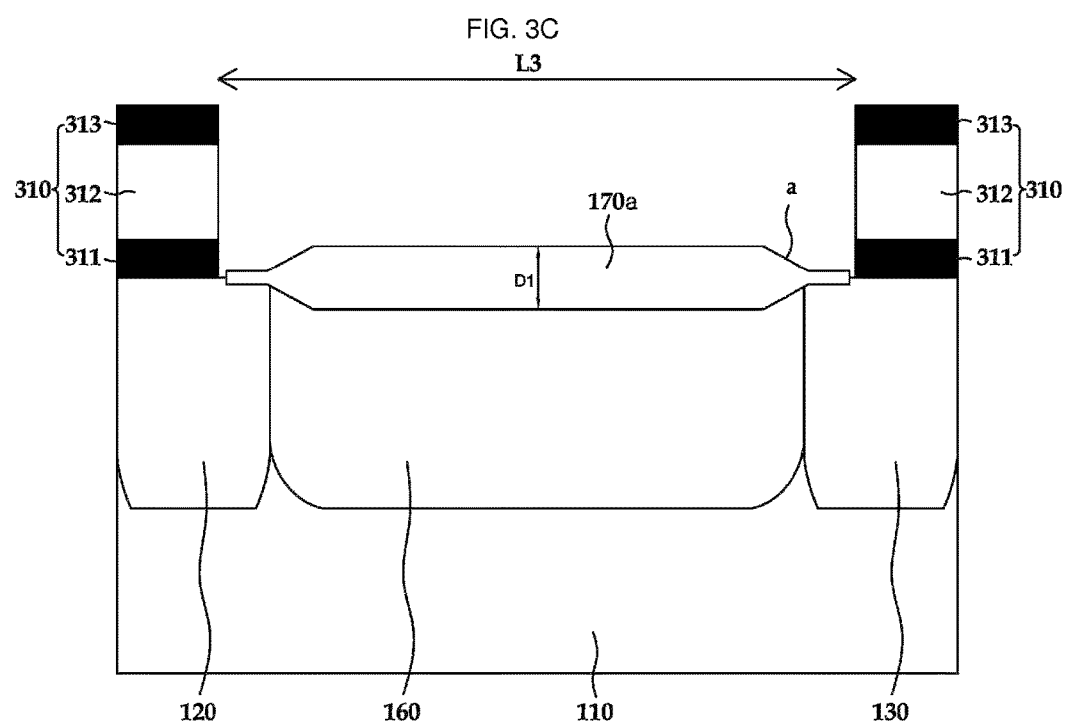

ULTRAHIGH VOLTAGE RESISTOR, SEMICONDUCTOR DEVICE, AND THE MANUFACTURING METHOD THEREOF

CROSS-REFERENCE TO RELATED APPLICATION(S)

This application claims the benefit under 35 USC 119(a) of Korean Patent Application No. 10-2014-0186348, filed on Dec. 22, 2014 in the Korean Intellectual Property Office, the disclosure of which is incorporated herein by reference in its entirety.

BACKGROUND

1. Field

The following description relates to a semiconductor device. The following description also relates to an ultrahigh voltage resistor and the manufacturing method thereof, including a semiconductor device forming an insulator with a predetermined thickness between a resistor of polysilicon and a well region to apply ultrahigh voltage with a small sized resistor.

2. Description of Related Art

A semiconductor device includes a memory cell array region and a periphery region. The memory cell array region is formed to have a plurality of memory cells to store data. The periphery region is formed to have circuit devices including a power supply circuit including a resistor, a memory cell program, and a control circuit to control deletion and access operation.

A resistor among the circuit devices formed on the periphery region is important in circuit operation of the semiconductor device. The resistor is formed using at least one metal line in a metal layer, which may include a junction resistor, a poly resistor and a metal resistor. Such a junction resistor is temperature sensitive, with a small width, and thereby has a huge change in resistor value. Moreover, a metal resistor has a difficulty in including a resistor with high resistor value because of its low resistor value. Thereby, a poly resistor with a small change in temperature and voltage is better for use in producing a resistor with high resistor value.

Generally, a high voltage resistor using a poly resistor uses a voltage distribution method using a plurality of unit resistors to provide a high breakdown voltage feature. In other words, a high voltage resistor is potentially formed by linking several low voltage unit resistors.

Generally, a unit resistor includes a well region formed on a semiconductor substrate, an oxide layer formed on the well region, and a polysilicon layer formed on the insulating layer. Moreover, two terminals are formed on a polysilicon layer, wherein each terminal is used as a terminal supplied with a power voltage or a ground terminal. Alternatively, each terminal is linked with a neighboring resistor of different unit for voltage distribution.

Generally, two unit resistors are used when forming a high voltage resistor using the unit resistors, for example, to form a 400V resistor. In other words, each resistor supplies resistance to 200V, respectively, and a well region including each unit resistor applies bias.

Thereby, a resistor with relatively high voltage feature is potentially formed on a semiconductor device.

However, a high voltage resistor structure using each unit resistor as aforementioned presents the following issues.

When a voltage that is higher than the aforementioned 400V is applied, a resistor is formed with another well region added accordingly, because a voltage distribution method is used. In this case, there is an issue of a size increase of a semiconductor substrate and semiconductor device increases as well because a well region is added.

Moreover, since bias is required to be applied on a well region of a unit resistor, a circuit component for providing bias is also additionally required.

Likewise, since semiconductor device development difficulty increases due to a requirement of circuit features as discussed to apply a bias on a well region, research development to make size of an equipment with a semiconductor device becomes more difficult.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The following description discloses a semiconductor device resistor that is able to bear an ultrahigh voltage while not increasing in semiconductor size.

Additionally, the description relates to a semiconductor device that enables functional improvement and efficient product design by providing a resistor that is configured to use ultrahigh voltage with a smaller area than other approaches.

An ultrahigh voltage resistor, a semiconductor device, and a corresponding manufacturing method are described further, according to the present description.

The following description relates to an ultrahigh voltage resistor including one well region on a semiconductor substrate and serially forming an insulator with a predetermined thickness and a resistor of polysilicon. The well region in the ultrahigh voltage resistor is a floating well region.

Accordingly, a resistor that is able to bear the ultrahigh voltage is provided because a voltage difference between a polysilicon and a well region is reduced even though ultrahigh voltage is applied to an insulator.

Thus, an example provides a high voltage resistor with a smaller size than a high voltage resistor based on another voltage distribution method. In other words, although the size is smaller, semiconductor chip size is reduced without detriment since a higher voltage may be applied. Accordingly functional improvement and efficient product design is achieved.

In one general aspect, a method for manufacturing a high voltage resistor includes forming a well region on a semiconductor substrate, forming a first insulator layer on a surface of the well region, forming a second insulator layer on a surface of the first insulator layer, and forming a polysilicon layer on a surface of the second insulator layer, wherein a first sloped side region is included when forming the first insulator layer, and a second sloped side region is included when forming the second insulator layer.

The first insulator layer may have a first width, the second insulator layer may have a second width, and the first width is may be smaller than the second width.

In another general aspect, a semiconductor device includes a first region for a first device, a second region for a second device, and a third region for a third device, wherein the first device and the second device each include a transistor, the third device includes a resistor, the second device and the third device operate at a higher voltage than the first device, and respective regions for the devices have different insulator thicknesses.

The insulator thickness of the third region may be thicker than the insulator thickness of the first region and thicker than the insulator thickness of the second region.

The insulator thickness of the third region may be greater than or equal to a total insulator thickness of the second region and the first region.

The third device may include a semiconductor substrate, a well region located on the semiconductor substrate, an insulator layer located on the top side of the well region; and a polysilicon layer located on the top side of the insulator layer.

The well region may be a floating region.

The insulator layer may include a first insulator layer and a second insulator layer formed on the first insulator layer, wherein the first insulator layer is formed to have a first sloped side region and the second insulator layer is formed to have a second sloped side region, and the bottom part of the insulator layer extends to the well region.

A first insulating film may be further located on the insulator layer in a stacked arrangement.

The insulator layer may be configured to line a trench region in a predetermined depth with reference to the surface of the well region.

A second insulator layer may be further located on the insulator layer of the trench region.

The semiconductor device may further include a drift region located on the well region, and a low concentration doping region located on the drift region.

The well region may be a non-floating region.

The semiconductor device may directly apply bias on the well region.

In another general aspect, a semiconductor device includes a first region including a first transistor, a second region including a second transistor, and a third region including a resistor, wherein the second transistor and the resistor each operate at a higher voltage than the first transistor, and respective regions for the first transistor, the second transistor, and the resistor have different insulator thicknesses.

The insulator thickness of the third region may be thicker than the insulator thickness of the first region and thicker than the insulator thickness of the second region.

The insulator thickness of the third region may be greater than or equal to a total insulator thickness of the second region and the first region.

The third device may include a semiconductor substrate, a well region located on the semiconductor substrate, an insulator layer located on the top side of the well region; and a polysilicon layer located on the top side of the insulator layer.

The well region may be a floating region.

The insulator layer may include a first insulator layer and a second insulator layer formed on the first insulator layer, wherein the first insulator layer is formed to have a first sloped side region and the second insulator layer is formed to have a second sloped side region, and the bottom part of the insulator layer extends to the well region.

A first insulating film may be further located on the insulator layer in a stacked arrangement.

The insulator layer may be configured to line a trench region in a predetermined depth with reference to the surface of the well region.

A second insulator layer may be further located on the insulator layer of the trench region.

The semiconductor device may further include a drift region located on the well region, and a low concentration doping region located on the drift region.

The well region may be a non-floating region.

The semiconductor device may directly apply bias on the well region.

Other features and aspects will be apparent from the following detailed description, the drawings, and the claims.

BRIEF DESCRIPTION OF THE DRAWINGS

FIG. 2 is a plan view corresponding to FIG. 1.

FIGS. 3A to 3F are flow sheets illustrating a ultrahigh voltage resistor manufacture method corresponding to FIG. 1.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
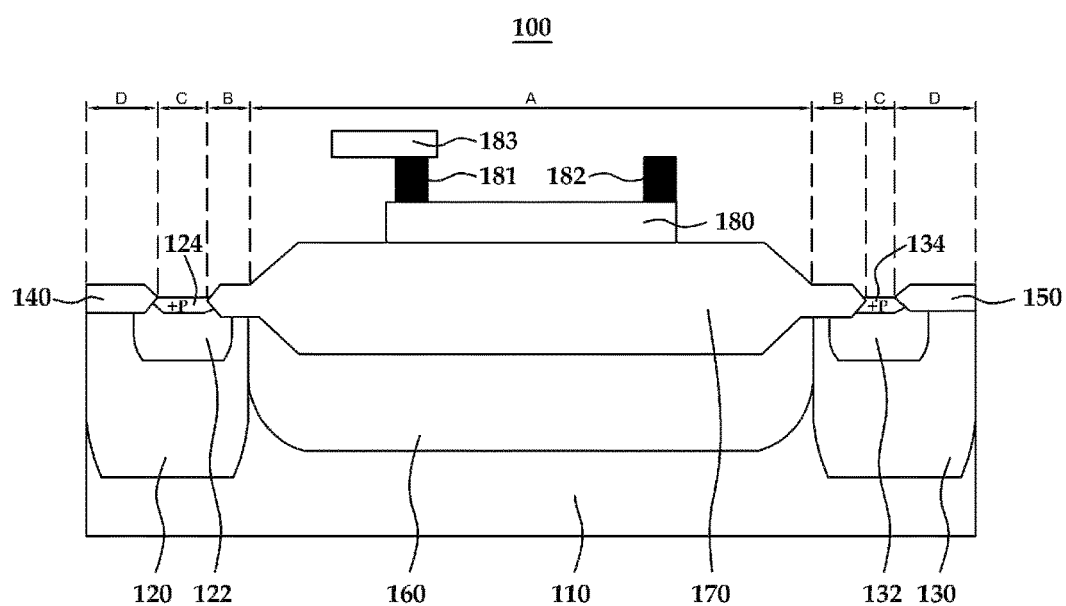
FIG. 1 is a side view illustrating an ultrahigh voltage resistor according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Certain examples are now described in greater detail with reference to the accompanying drawings.

In the following description, the same drawing reference numerals are used for the same elements even in different drawings. The matters defined in the description, such as detailed constructions and elements, are provided to assist in a comprehensive understanding of the present examples. Accordingly, it is apparent that the examples are potentially carried out without those specifically defined matters. Also, well-known functions or constructions are not described in detail since they would obscure the examples with unnecessary detail.

While the expressions such as "first" or "second" are used to refer to various elements, the elements are not intended to be limited by the expressions. The expressions are used only for the purpose of distinguishing one element from the other.

Thus, the expressions are used herein only for the purpose of explaining specific embodiments and are not intended to limit the present examples. An expression in singular form encompasses plural meaning, unless otherwise specified. Throughout the description, the expression "comprise" or "have" is used only to designate the existence of a characteristic, number, step, operation, element, component or a combination thereof which is described herein, but not to preclude the possibility of the existence of one or more of the other characteristics, numbers, steps, operations, elements, components or combinations of these or additions.

The present examples provide an ultrahigh voltage resistor of a smaller size than a high voltage resistor according to an alternative voltage distribution method by forming an insulator between a well region and a polysilicon region of a semiconductor substrate.

Hereinafter, a ultrahigh resistor and its manufacture method and a corresponding semiconductor device according to the present examples are illustrated in further detail with reference to the attached drawings.

FIG. 1 is a side view of an ultrahigh voltage resistor according to an example.

Referring to FIG. 1, a semiconductor substrate 110 is provided. A semiconductor substrate 110 of the example is a p-type substrate doped with a low concentration p-type impurity. Three well regions are formed on the semiconductor substrate 110.

On left and right well regions of a semiconductor substrate 110, regions isolating for electric separation from a neighboring device are formed. These are referred as a first isolation well region 120 and a second isolation well region 130.

P-type well regions 122, 132 are formed on the first isolation well region 120 and the second isolation well region 130 and high concentration doping regions P+ 124, 134 are formed on the p-type well regions 122, 132. The first isolation well region 120 and the second isolation well region 130 are p-type with a lower concentration than p-type well regions 122, 132.

Moreover, Local Oxidation of Silicon (LOCOS) layers 140, 150 that are separation layers for separation between devices, are formed on parts of top sides of the first isolation well region 120 and the second isolation well region 130.

A well region 160 doped with a different impurity from the semiconductor substrate 110 is formed on a center part of the semiconductor substrate 110 that is between the first isolation well region 120 and the second isolation well region 130. The well region 160 is formed in a floating node state with a bias not applied. One reason the well region 160 is formed as described above as a floating node is to provide a high breakdown voltage by reducing a voltage difference between resistor polysilicon regions, as explained below, using coupling phenomena. Hereinafter, the well region 160 is referred to as a 'floating well region.' However, examples herein do not require being formed with a floating node. This is because a breakdown voltage margin is also possibly obtained by forming an insulator thicker when the example is not formed with a floating node, as will be discussed further, below.

An insulator 170 is formed on top of the floating well region 160. Such an insulator is formed to have a thickness that is enough to bear about over 700V, which is considered to be an ultrahigh voltage. Such an insulator 170 is not formed in a rectangular parallelepiped form but is formed through a Double LOCOS process. Hence, left/right side parts of the insulator 170 are formed in two stepped stages. An illustration of stages in formation of these regions is presented in FIGS. 3A-3F as flow sheets. However, a length of the insulator 170 is formed to be slightly longer than the length of the floating well region 160 due to the double LOCOS process.

A resistor polysilicon layer 180 is formed on a top side part of the floating well region 160. The polysilicon layer 180 is a part to which the ultrahigh voltage is directly applied. Accordingly, a first terminal 181 that is a + terminal that supplies voltage and a second terminal 182 that is a − terminal are formed on the polysilicon layer 180. A PAD 183 is connected to supply a power voltage to the first terminal 181, where the PAD is a designated surface area for an electrical contact.

An ultrahigh voltage resistor formed in this structure is designed to have a predetermined thickness for the insulator 170 formed between the polysilicon layer 180 and the floating well region 160 to bear an ultrahigh voltage. As a result, the ultrahigh voltage resistor is potentially supplied with a higher voltage while having a smaller size, but while successfully processing an operation that is identical with the conventional high voltage resistor.

FIG. 2 is a plan view of an ultrahigh voltage resistor as illustrated in FIG. 1.

Referring to FIG. 2, an insulator region A is formed with a PAD 183 and a polysilicon layer 180 on a top side thereof, a left/right side region B surrounding an insulator region A, and an isolation well tap region C and a LOCOS region D are formed surrounding one another as illustrated in FIG. 2. This corresponds with the displayed region illustrated in the example of FIG. 1.

For example, an ultrahigh voltage resistor of the present examples is optionally formed with a plurality of polysilicon layers which are shown in FIG. 2. At least one polysilicon layer 180-180$n$ is provided and connected in series with each other as illustrated in FIG. 2. Here, a connection method using a contact member 185 of a metal structure or a contact member 185 comprised of poly is used. The contact member 185 refers to FIG. 2. By forming a plurality of polysilicon layers 180-180$n$ as aforementioned and lengthening the total length, such a design approach enables responding to applied voltage size more effectively. A number of polysilicon layers is determined by considering a size of an applied voltage and an entire desired size of a semiconductor device.

Additionally, a manufacturing process of the ultrahigh voltage resistor of the above-described structure is presented referring to FIGS. 3A-3F. FIGS. 3A-3F are flow sheets illustrating a manufacturing method of the ultrahigh voltage resistor.

Referring to FIG. 3A, a first isolation well region 120, a second isolation well region 130 and a floating well region 160 are all formed on a p-type semiconductor substrate 110. A p-type well region and a p-type high concentration region P+ are also formed on the first isolation well region 120 and the second isolation well region 130, but are not shown the flow sheet.

A first LOCOS process is implemented at a state wherein the well regions 120, 130 and 160 are formed on the semiconductor substrate 110. The first LOCOS process forms a first mask pattern 300 of L1 width on the first isolation well region 120 and a tope side of the second isolation well region 130. The first mask pattern 300 comprises an oxide 301, a nitride 302 and a Photo Resistor (PR) mask 303 from below. The first mask pattern 300 herein has a width of L1.

A first oxide process is implemented after removing the photo resistor mask 303 in the above state. Afterwards, the oxide 301 and the nitride 302 are removed and an insulator 170a with a first thickness D1 is formed. This process refers to FIG. 3B. A left side and right side of the insulator 170a herein each have one slope side (a) extending in a bird beak shape.

Next, a second LOCOS process is implemented as illustrated in FIG. 3C. The second LOCOS process includes a process of forming a second mask pattern 310 with a wider width than a first mask pattern 300 on a top side of the first isolation well region 120 and the second isolation well region 130. The second mask pattern 310 has a layer structure that is identical with the layer structure of the first mask pattern 300. The second mask pattern 310 has a width of L3 which is wider than the width of L1. Thereby, an edge of the insulator 170a thinned in the first LOCOS process is formed with sufficient thickness. Thus, the second mask pattern 310 used in the second LOCOS process is further applied in a manner such that the edge portion of the insulator 170a formed to be thin in the first LOCOS process is formed to be of an even thickness through the second LOCOS process.

Figure 3B:
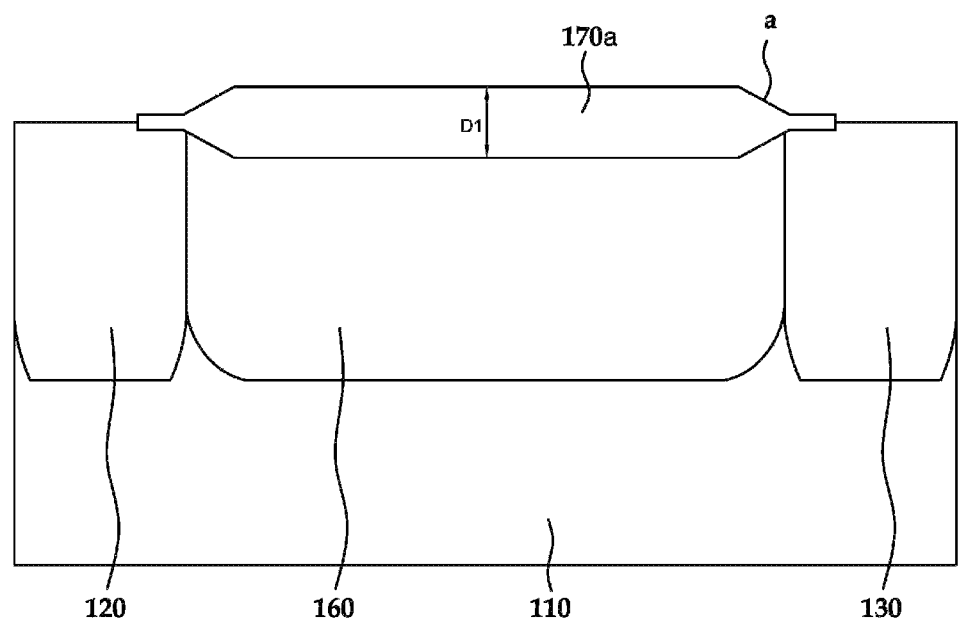
Figure 3D:
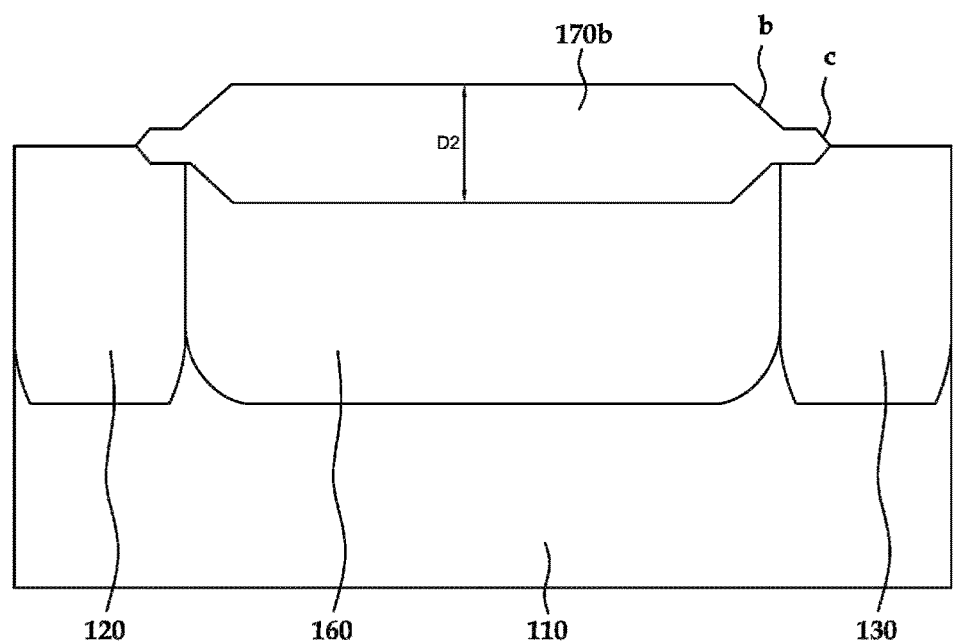

The second oxidation process is implemented after removing the photo resistor mask 313 in a manner similar to the first oxidation process of FIG. 3B. Additionally, an insulator 170b with a second thickness D2 that is thicker than the first thickness D1 is formed when the oxide 311 and the nitride 312 are removed. A drawing showing the second oxide process is illustrated in FIG. 3D. Likewise, the insulator 170b of the second thickness D2 assumes its final thickness. In other words, the insulator of drawing code 170b corresponds to 170 of FIG. 1.

The left and right sides of the insulator 170b are also formed to extend in a bird beak shape when the insulator 170b of the second thickness D2 is formed. Thus, the left and right side regions of the insulator 170b forms into two stair shapes. In other words, the insulator 170b of FIG. 3D includes two sloping sides b and c unlike FIG. 3B.

Figure 3E:
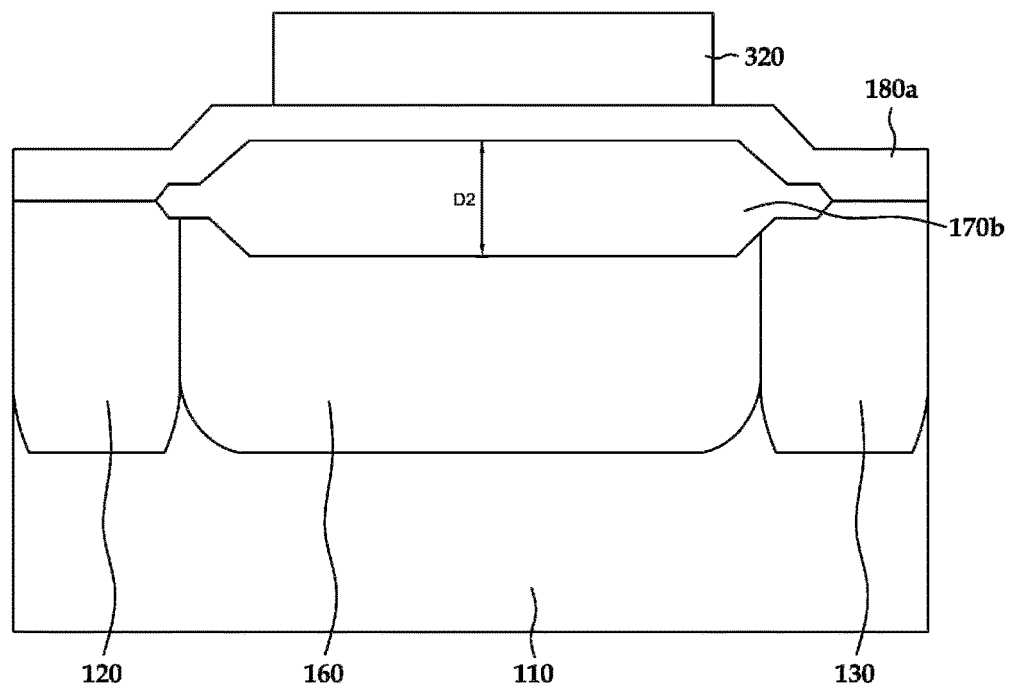

FIG. 3E is a polysilicon forming process. As illustrated in FIG. 3E, a polysilicon layer 180a is formed on the first isolation well region 120, the second isolation well region 130 and on top of the insulator 170b.

A part of the polysilicon layer 180a becomes a final polysilicon layer 180. A third mask pattern 320 is formed with predetermined pattern 320 on the polysilicon layer 180a.

Figure 3F:
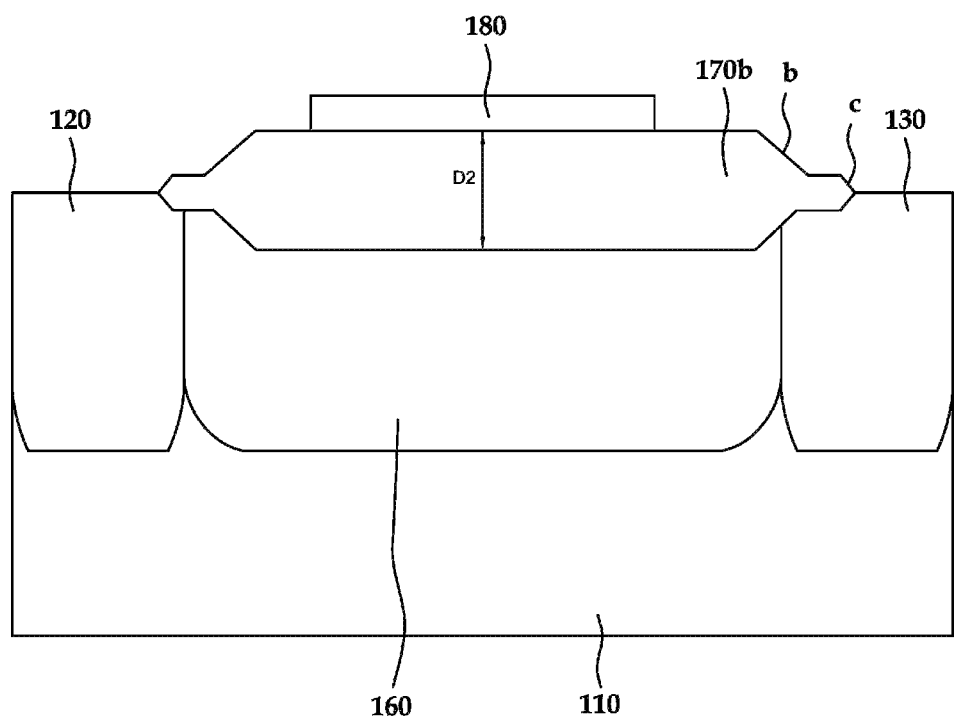

Hereinafter, when a wet etching process is implemented according to the third mask pattern 320, the polysilicon layer 180a formed on the first isolation well region 120 and the second isolation well region 130 is removed. When the third mask pattern 320 removal process is implemented, an ultrahigh voltage resistor including the polysilicon layer 180 is formed on only part of the top side of the insulator 170b and is manufactured as illustrated in FIG. 3F.

An example discloses manufacture of an ultrahigh voltage resistor including the insulator 170b and the resistor polysilicon layer 180 formed on a floating well region 160 through implementing a LOCOS process twice and a polysilicon formation process.

Figure 4A:
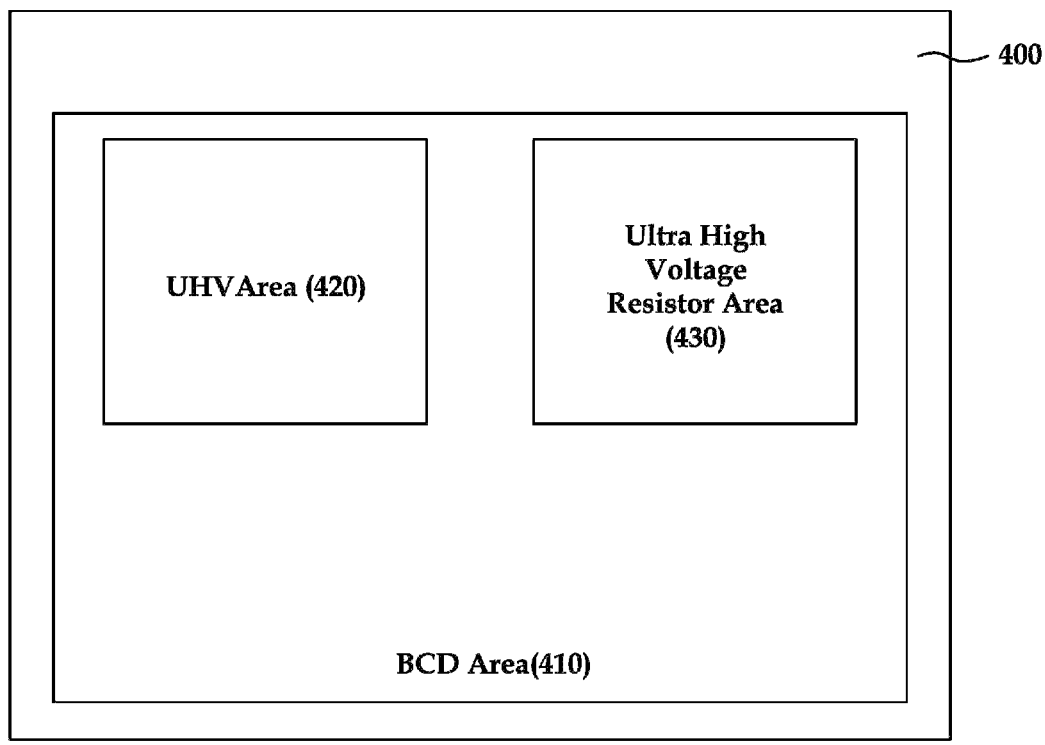
FIG. 4A is a plan view illustrating a semiconductor device applicable to an example.
Figure 4B:
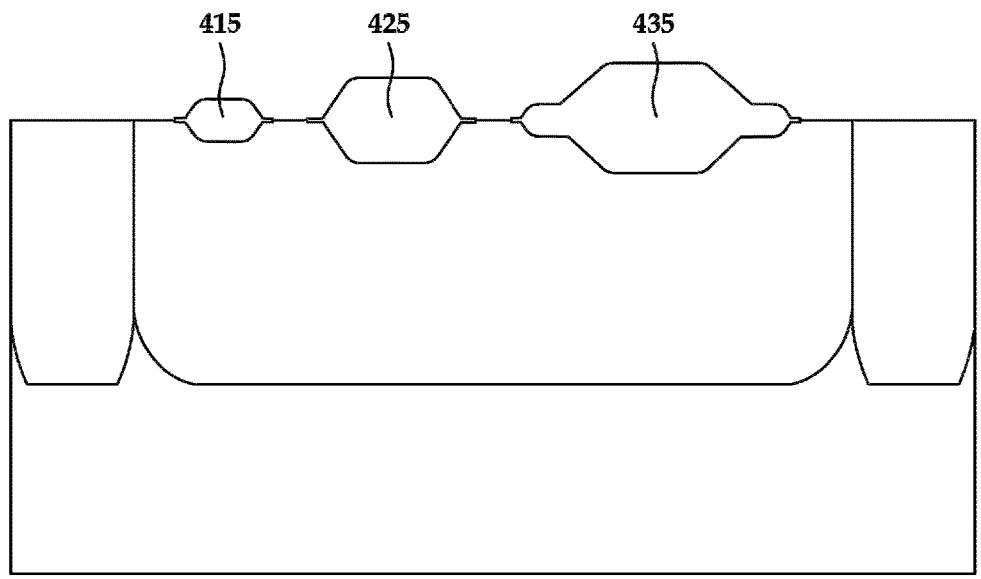
FIG. 4B is a plan view corresponding to FIG. 4A.

FIG. 4A and FIG. 4B are a cross-sectional view and a side view of a semiconductor chip applying an example.

A semiconductor chip 400 according to an example overall includes three regions as illustrated in the drawing. The three regions are a BCD region 410 for Bipolar Complementary Metal-Oxide Semiconductor (CMOS) Diffusion Metal-Oxide Semiconductor (DMOS) (hereinafter referred to as BCD) device, a Ultrahigh Voltage (UHV) region 420 for an Ultrahigh Voltage (UHV) device, and an ultrahigh resistor (UHV resistor) region 430. In the BCD region 410, an operation using a voltage of about 3V to 100V is possible and uses a smaller operating voltage than the ultrahigh voltage device. Additionally, the UHV range is about 200V to 800V. The semiconductor chip of the present example is used in a power management integrated circuit (PMIC) and provides an ultrahigh voltage resistor that is operable at about 700V voltage.

Reciting a size and thickness of each region, the UHV region 420 and the UHV resistor region 430 each have an identical size in FIGS. 4A-4B. However, examples are not limited to the size of the regions being the same. For example, the UHV resistor region 430 is optionally formed further smaller.

Additionally, the insulator thicknesses of the three regions 410, 420 and 430 are formed to be different. In other words, in an example, a thickness is thickest in an order of a first insulator 415 of the BCD region, a second insulator 425 of the UHV region and a third insulator 435 of the UHV resistor 430 region. In other words, by forming both an insulator of lower thickness that is used for the BCD device and a thicker insulator that is used for the UHV device, an insulator with thickness that is optimized for the UHV resistor's operation is formed.

Accordingly, a semiconductor chip 400 according to an example includes regions of different thickness on one IC chip.

Next, a structure of an ultrahigh voltage resistor according to an example is illustrated.

Referring to the attached drawings, one of the present examples discloses a resistor of a differing structure that does not use the aforementioned structure or bears an ultrahigh voltage despite a floating well region not being formed.

Moreover when reciting a different structure of the ultrahigh voltage resistor, a structure identical with the structure of the ultrahigh voltage resistor of FIG. 1 is omitted.

Figure 5:
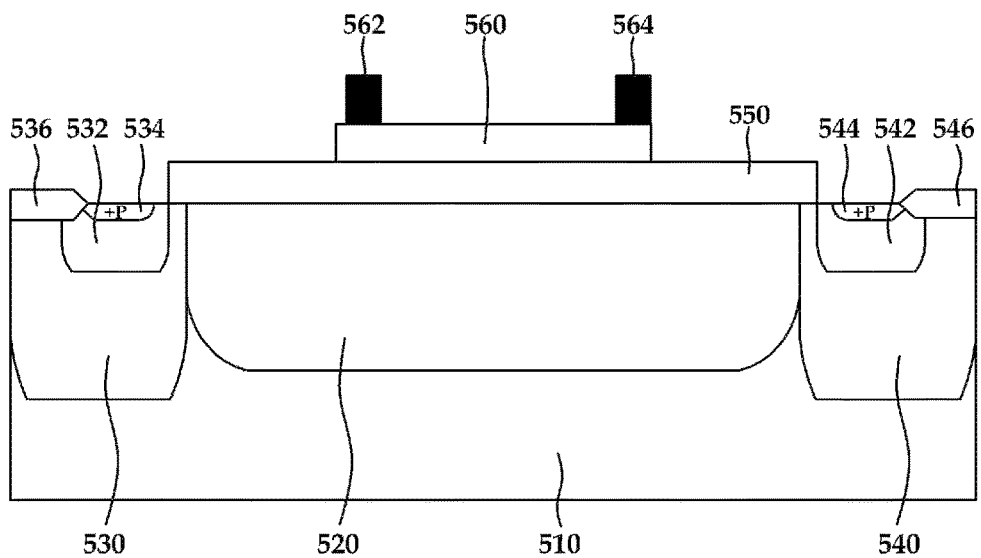
FIGS. 5 to 10 are side views illustrating an ultrahigh voltage resistor according to another example.

FIG. 5 is a side view of an ultrahigh voltage resistor according to a second example.

The ultrahigh voltage resistor of FIG. 5 is an example that is applicable when the double LOCOS process is not available to be conducted. In such an approach, a processing cost is potentially lower than LOCOS process.

An insulating layer 550 of the oxide is formed on a top side of a floating well region 520 of a semiconductor substrate 510. The insulating layer 550 is formed by a deposition process instead of the double LOCOS process described above. Moreover, a thickness of the insulating layer 550 is controlled to have a desired thickness by controlling a time of the deposition process.

A resistor polysilicon layer 560 is formed on the insulating layer 550. A first terminal 562 and a second terminal 564 are connected with the polysilicon layer 560.

A breakdown voltage between the polysilicon layer 560 and the floating well region 520 is potentially sufficiently obtained even in this alternative structure.

Meanwhile, a first isolation well region 530 and a second isolation well region 540 are formed on left and right of the floating well region 520 for device separation, respectively, with reference to FIG. 5. Moreover, p-type well regions 532, 542 are formed on the first isolation well region 530 and the second isolation well region 540 and high concentration doping regions P+ 534, 544 are formed on the p-type well regions 532, 542. Additionally regions, LOCOS 536, 546 are formed. These structures are identical with corresponding parts of FIG. 1.

Figure 6:
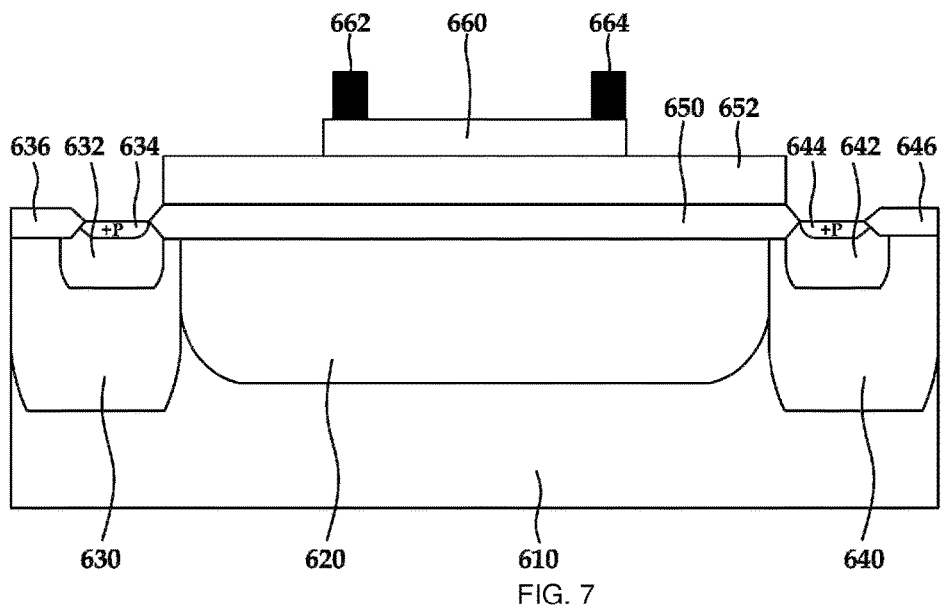

FIG. 6 is a side view of an ultrahigh voltage resistor according to a third example.

An ultrahigh voltage resistor of FIG. 6 is formed through a LOCOS process and a deposition process together. In other words, it is a structure wherein a LOCOS 650 is formed on a floating well region 620 for isolation and additionally forms an insulating layer 652 on the LOCOS 650 by implementing the deposition process.

When the LOCOS 650 and the insulating layer 652 are used together in this manner, a breakdown voltage condition that is provided in FIG. 1 is potentially satisfied although a thickness of the insulating layer 652 is formed to be thinner than thickness of an insulator 170 as illustrated in FIG. 1.

Figure 7:
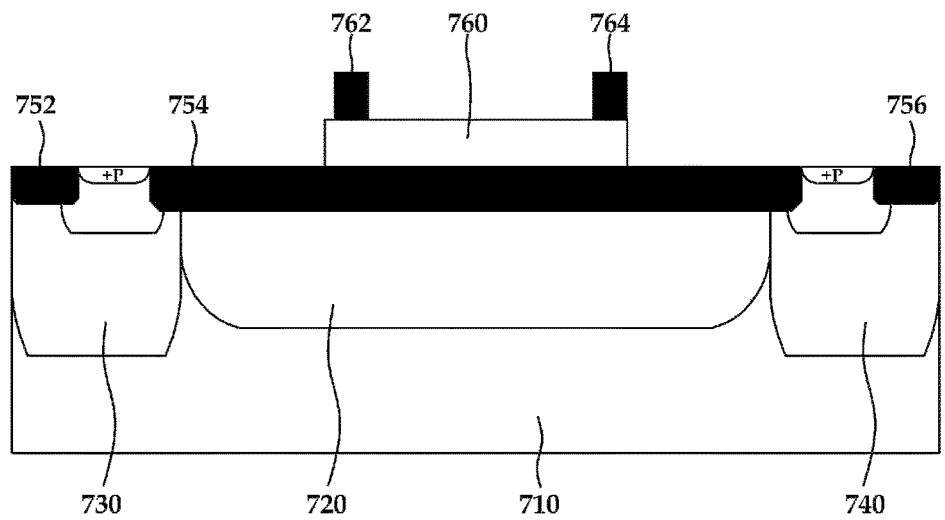

FIG. 7 is a side view of an ultrahigh voltage resistor according to a fourth example.

FIG. 7 is applied when it is not possible to manufacture the semiconductor device through the LOCOS process.

Thin trench regions, 752, 754, 756, such as using a Shallow Trench Isolation (STI) architecture are formed on a floating well region 720, a first isolation well region 730 and a second isolation well region 740 on a semiconductor substrate 710 instead of LOCOS as discussed above. The trench regions are used as insulators by filling oxide in the trench regions 752, 754, 756.

Accordingly, a thickness of an insulator corresponds to a depth of the trench regions 752, 754, 756. Thus, a thickness of an insulator is further formed to be thicker as the trenches 752, 754, 756 are formed to be deeper.

On the other hand, the depth of trench region 752 of the floating well region 720 and the depth of trench regions 754, 756 of isolation well regions 730, 740, in some examples are identical or in other examples are formed differently.

Figure 8:
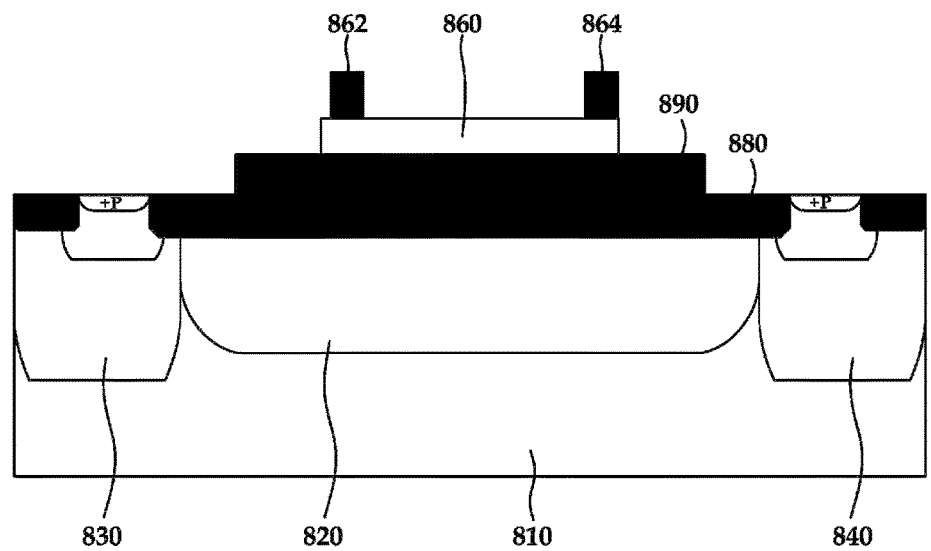

FIG. 8 is a side view of an ultrahigh voltage resistor according to a fifth example.

Referring to FIG. 8, a trench 880 is formed on a floating well region 820 and an oxide 890 is formed in two stages as compared with an ultrahigh voltage resistor as illustrated in the fourth example.

An ultrahigh voltage resistor is potentially formed with this structure.

Figure 9:
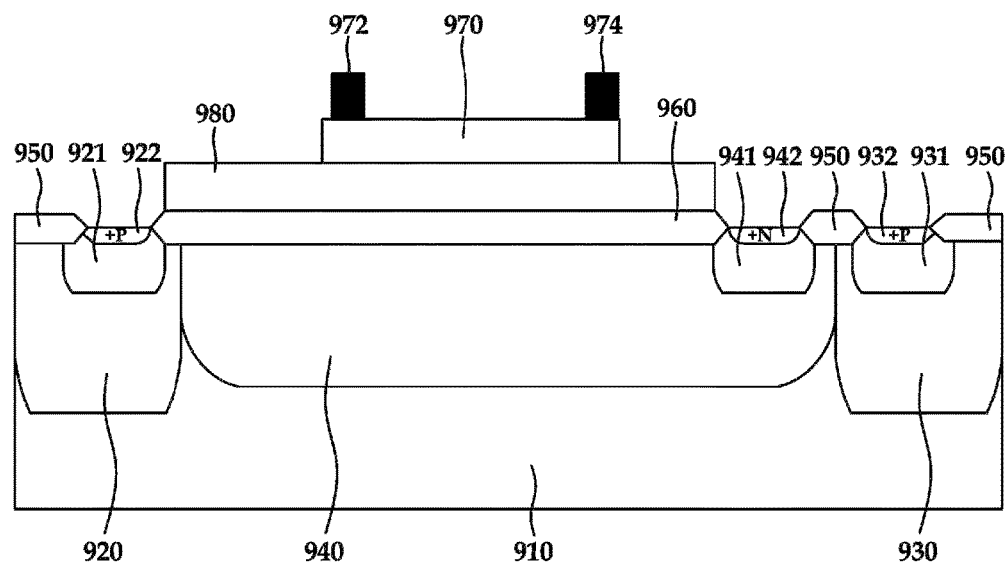

FIG. 9 is a side view of an ultrahigh voltage according to a sixth example.

The sixth example includes a structure in which a bias is potentially applied without forming a well region on a semiconductor substrate with a floating node.

In other words, in the example of FIG. 9, a first isolation well region 920 and a second isolation well region 930 are formed on a semiconductor substrate 910 for electric separation from an adjacent device and, a well region 940 doped with a different impurity is formed between the first isolation well region 920 and the second isolation well region 930.

P-type well regions 921, 931 are formed on the first isolation well region 920 and the second isolation well region 930, and high concentration doping regions P+ 922, 932 are formed on the p-type well regions 921, 931.

An n-type drift region 941 is formed on a well region 940 and, a high concentration doping region N+ 942 is formed on part of the drift region 941.

Additionally, LOCOS regions 950, 960 are formed between high concentration doping regions 922, 942, 932 on a semiconductor substrate 910 surface.

Moreover, an insulating layer 980 and a polysilicon layer 970 are serially formed on the well region 940.

Meanwhile, a bias is applied on the well region 940 in the sixth example, and in this manner, a thickness of the LOCOS 960 and the insulator 980 between the polysilicon layer 970 and the well region 940 are also able to be formed with a predetermined thickness.

Figure 10:
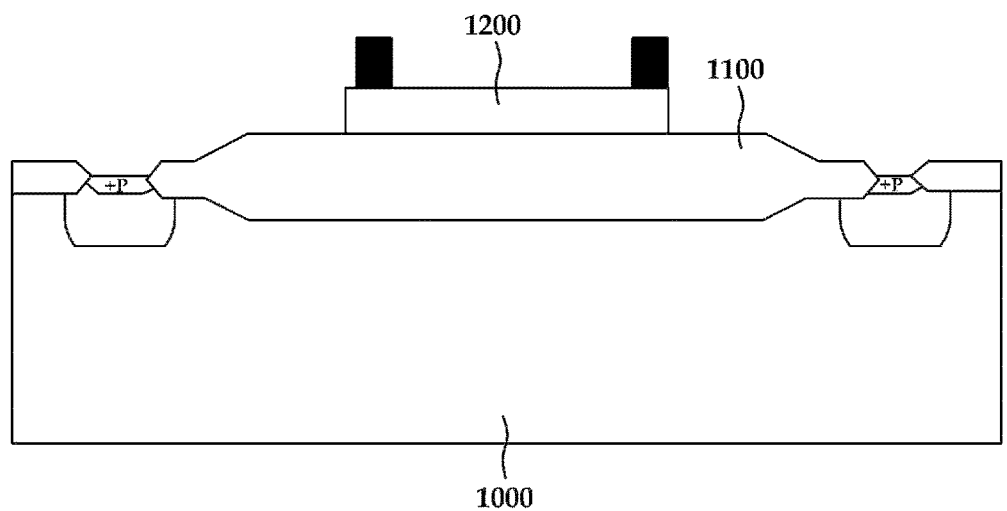

FIG. 10 is a side view of an ultrahigh voltage resistor according to the seventh example. The seventh example does not form a well region.

Referring to the drawing, a well region is not formed on a p-type semiconductor substrate 1000, but instead an insulator 1100 is directly formed on the substrate 1000. In other words, p-type well regions are formed on the left and right regions of the insulator 1100 and a high concentration doping region P+ is formed on the p-type well regions.

The insulator 1100 of the seventh example is possibly formed in various methods. For example, the insulator 1100 is possibly formed not only with a double LOCOS process but also with a trench process and a deposition process.

A polysilicon layer 1200 is formed on the top side of the insulator 1100.

In this example, the insulator 1100 thickness is potentially formed to be a thick layer. That is, the insulator thickness is formed to be thicker than it would be in an example that uses a floating well region. For example, the insulator 1100 is chosen to be a thickness that is thicker than that of an insulator of FIG. 1. Thereby, a same effect with an ultrahigh voltage resistor of FIG. 1 is provided. If the insulator 1100 is formed to be thinner than thickness of an insulator 170 that is formed on a floating well region 160 of FIG. 1, a sufficient breakdown voltage is potentially not obtained and hence the device is potentially destroyed.

Figure 11:
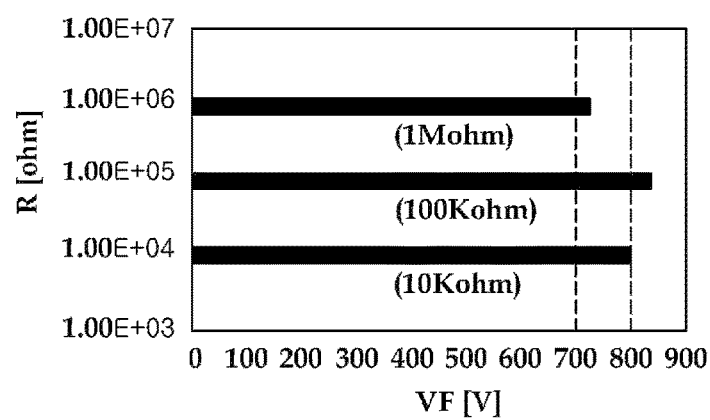
FIG. 11 is a graph illustrating an electric feature of an ultrahigh voltage resistor according to an example.

FIG. 11 is a graph illustrating an electric feature of an ultrahigh voltage resistor having various structures according to the present examples. For example, FIG. 11 illustrates VF (Forward Voltage) values corresponding to various resistance values R.

An ultrahigh voltage resistor obtains a breakdown voltage that is able to bear an ultrahigh voltage over 700V of in a condition of resistance of various values. FIG. 11 shows voltages that the resistor bears for resistors of 10 Kohm, 100 Kohm, and 1 Mohm.

That is, an ultrahigh voltage resistor according to examples is formed to operate even though its size is smaller than conventional ultrahigh voltage resistor.

Accordingly, a design of a semiconductor device design is varied because a resistor applicable on ultrahigh voltage is provided even when a semiconductor device size is reduced.

An example comprises a semiconductor device ultrahigh voltage resistor that applies ultrahigh voltage without distributing voltage in one well region, without using a method of forming a ultrahigh voltage resistor through a voltage distribution method.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a high voltage resistor comprising:
    forming a well region on a semiconductor substrate;
    forming a first insulator layer on a surface of the well region;
    forming a second insulator layer on a surface of the first insulator layer; and
    forming a polysilicon layer on a surface of the second insulator layer,
    wherein a first sloped side region extending a first sloped distance above the surface of the semiconductor substrate is included when forming the first insulator layer, and a second sloped side region extending a second sloped distance above the surface of the semiconductor substrate is included when forming the second insulator layer.

2. The method for manufacturing the high voltage resistor of claim 1, wherein
    the first insulator layer has a first width,
    the second insulator layer has a second width, and
    the first width is smaller than the second width.

3. The method for manufacturing the high voltage resistor of claim 1,
    wherein the forming of the first insulator layer comprises a first Local Oxidation of Silicon (LOCOS) process using a mask region set to a first width, and
    the forming of the second insulator layer comprises a second LOCOS process using a mask region set to a second width wider than the first width.

4. The method for manufacturing the high voltage resistor of claim 1, wherein the first sloped distance of the first sloped side region is greater than the second sloped distance of the second sloped side region.

5. The method for manufacturing the high voltage resistor of claim 1, wherein the first sloped side region is disposed on the well region.

6. A semiconductor device comprising:
    a first region of a semiconductor substrate;
    a second region of the semiconductor substrate; and
    a third region of the semiconductor substrate comprising a resistor,
    wherein the second region and the resistor each operate at a higher voltage than the first region, and
    an insulator of the third region comprises a third thickness that is thicker than a first thickness of an insulator of the first region and extends farther above a surface of the semiconductor substrate than the insulator of the first region, and is thicker than a second thickness of an insulator of the second region and extends farther above the surface of the semiconductor substrate than the insulator of the second region.

7. The semiconductor device of claim 6, wherein the third thickness of the insulator of the third region extends farther below the surface of the semiconductor substrate than each of the first thickness of the insulator of the first region and the second thickness of the insulator of the second region extend below the surface of the semiconductor substrate.

8. The semiconductor device of claim 6, wherein the third thickness of the insulator of the third region is greater than or equal to a total of the second thickness of the insulator of the second region and the first thickness of the insulator of the first region.

9. The semiconductor device of claim 6, wherein the resistor comprises the semiconductor substrate, a well region located on the semiconductor substrate, the insulator of the third region comprising an insulator layer located on the top side of the well region; and a polysilicon layer located on the top side of the insulator layer.

10. The semiconductor device of claim 9, wherein the well region is a floating region.

11. The semiconductor device of claim 9, wherein the insulator layer comprises a first insulator layer and a second insulator layer formed on the first insulator layer, wherein the first insulator layer is formed to have a first sloped side region and the second insulator layer is formed to have a second sloped side region, and the bottom part of the insulator layer extends to the well region.

12. The semiconductor device of claim 9, wherein a first insulating film is further located on the insulator layer in a stacked arrangement.

13. The semiconductor device of claim 9, wherein the insulator layer is configured to line a trench region in a predetermined depth with reference to the surface of the well region.

14. The semiconductor device of claim 13, wherein a second insulator layer is further located on the insulator layer of the trench region.

15. The semiconductor device of claim 9, further comprising:
    a drift region located on the well region; and
    a high concentration doping region located on the drift region.

16. The semiconductor device of claim 15, wherein the well region is a non-floating region.

17. The semiconductor device of claim 16, wherein the semiconductor device directly applies bias on the well region.

* * * * *